United States Patent [19]

Gillissie

[11] 4,176,751

[45] Dec. 4, 1979

[54] CONTAINER APPARATUS FOR HANDLING SEMICONDUCTOR WAFERS

[75] Inventor: Michael J. E. Gillissie, Kanata, Canada

[73] Assignee: Northern Telecom Limited, Montreal, Canada

[21] Appl. No.: 762,862

[22] Filed: Jan. 27, 1977

[51] Int. Cl.² .................... A47G 19/08; B65B 21/02
[52] U.S. Cl. .................................. 211/41; 220/22.3; 206/328; 414/405; 53/392
[58] Field of Search .............. 214/301, 300, 307, 312, 214/152, 10.5 R; 118/500, 506; 53/246, 392; 206/328, 334, 454; 211/40-41; 220/22.3; 361/415; 224/45 G, 45 P

[56] References Cited

U.S. PATENT DOCUMENTS

| | | | |
|---|---|---|---|
| 3,497,058 | 2/1970 | Walker et al. .................. 206/334 |
| 3,877,134 | 4/1975 | Shanahan ....................... 211/41 X |
| 3,926,305 | 12/1975 | Wallestad ...................... 206/334 |
| 3,934,733 | 1/1976 | Worden ......................... 214/301 X |
| 3,949,891 | 4/1976 | Butler et al. ................... 214/301 |
| 4,023,691 | 5/1977 | Perel ............................. 214/152 |
| 4,043,451 | 8/1977 | Johnson ......................... 206/334 |

Primary Examiner—Stephen G. Kunig
Assistant Examiner—R. B. Johnson
Attorney, Agent, or Firm—Sidney T. Jelly

[57] ABSTRACT

A modified etch boat acts as a transfer device for transferring wafers, in bulk. An etch boat has a longitudinal hole through one wall near the top edge, the hole periphery extending into Vee grooves in the etch boat. With wafers in the grooves, a rod inserted through the hole prevents wafers from falling out. With wafers in a storage box, the modified etch boat is positioned on the storage box, the hole inverted, and then the rod inserted after the wafers have transferred. The etch boat can then be inverted over a furnace boat, for example. After positioning on the furnace boat, with the wafers lifted slightly, the rod is removed and then the etch boat lifted off. The reverse operation is used to transfer from a furnace boat.

1 Claim, 5 Drawing Figures

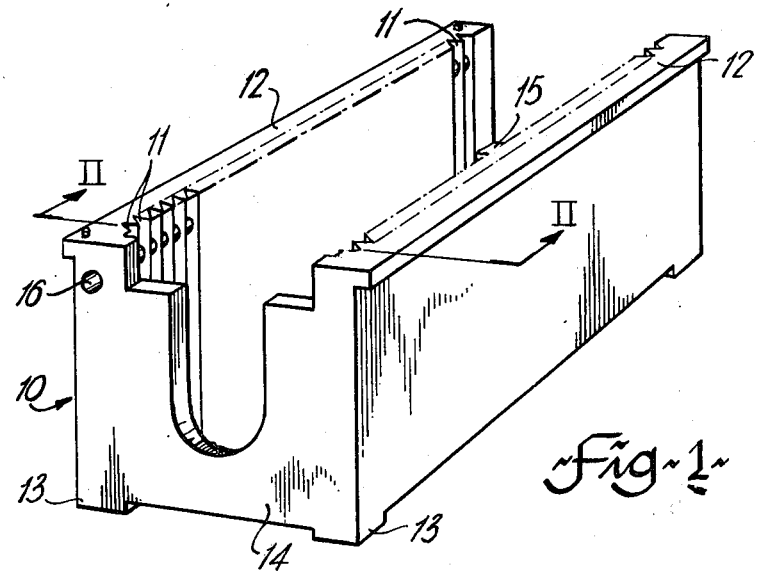
Fig-1-
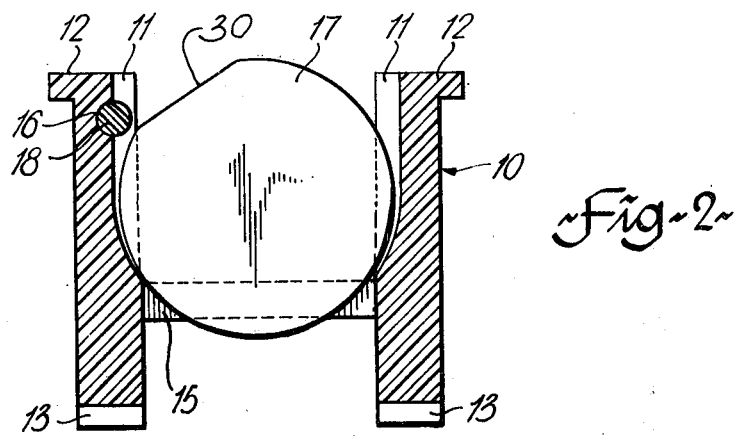
Fig-2-
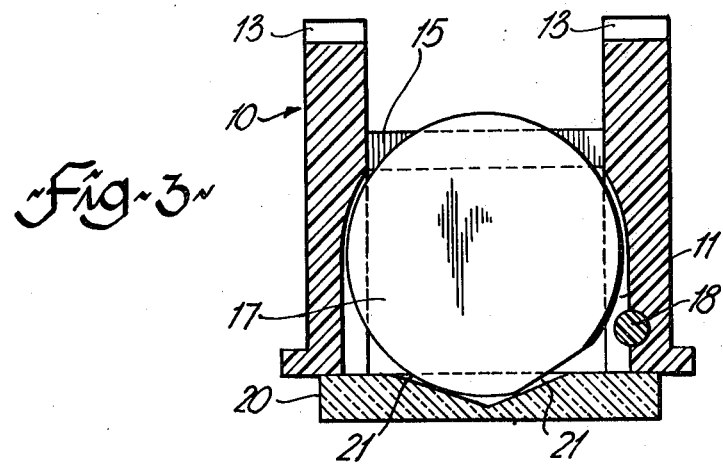
Fig-3-

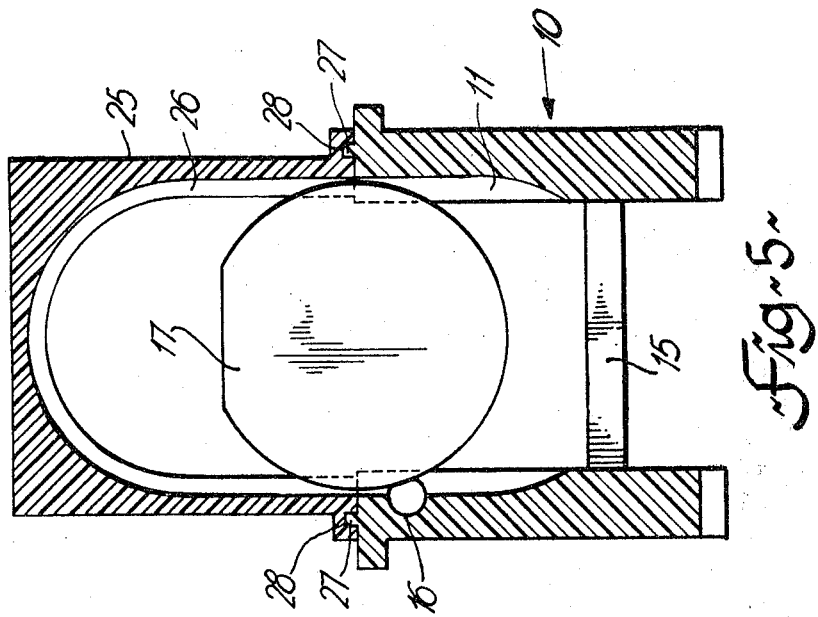
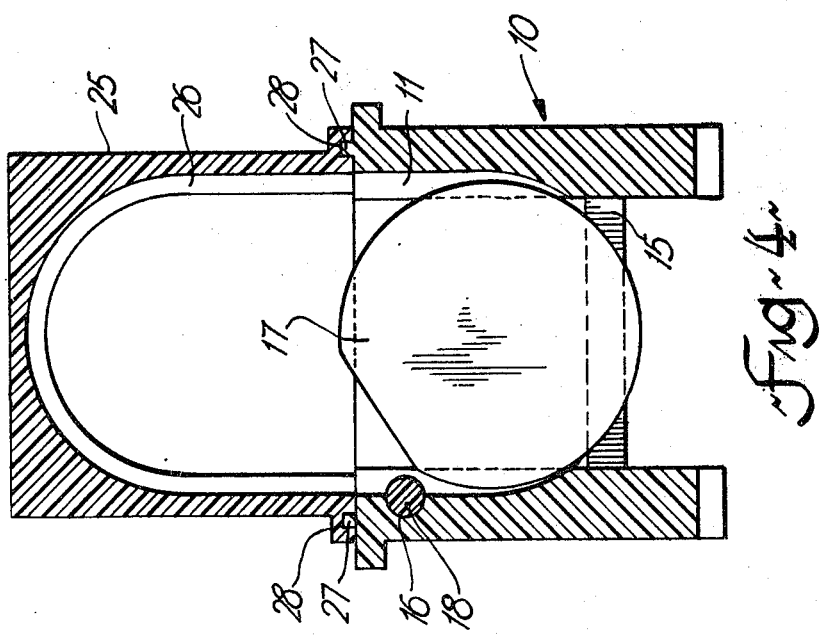

CONTAINER APPARATUS FOR HANDLING SEMICONDUCTOR WAFERS

This invention relates to apparatus for transferring semiconductor wafers, from one holder to another, and to a method of transfer using such apparatus.

In the processing, and storage, of semiconductor wafers, they have to be transferred back and forth between etch boats to furnace boats, and possibly to and from storage boxes. It is essential that absolute cleanliness be observed to avoid contamination and toward this end it is important to handle the wafers as little as possible—indeed handling, except with special implements, is to be avoided.

Also, wafers are treated in bulk, to reduce costs and to obtain a reasonable throughput. It is therefore desirable that the transfer of wafers be in bulk, to the extent that one batch of wafers to be transferred at one time. It has been proposed to use a transfer cassette to which the wafers are transferred, for example from a storage box or etch boat, the wafers then being transferred from the transfer cassette to, for example, a furnace boat. A transfer cassette is used to transfer wafers from a furnace boat back to an etch boat. During such transfers edge chipping can occur. Also, alignment between the various items is difficult. Movement can occur during turning over of cassette and boat, and, with 3" wafers, the apparatus is difficult to hold.

In accordance with the present invention, an etch boat is modified to form a holder and to accept a transversely extending rod or tube, inserted after wafers are in the boat, which retains the wafers in position. The holder or etch boat is then turned over, and positioned over a furnace boat, the wafers fitting in slots or grooves in the furnace boat, and the rod or tube then removed—allowing removal of the etch boat. To return the wafers to the holder or etch boat, it is positioned over the furnace boat holding the wafers. The rod or tube inserted and the holder or etch boat lifted off. The rod or tube, when in position, always retains the wafers in the holder or etch boat.

The invention will be readily understood by the following description in conjunction with the accompanying drawings, in which:

FIG. 1 is a perspective view of an etch boat in accordance with the present invention;

FIG. 2 is a cross-section on the line II—II of FIG. 1, with rod in position;

FIG. 3 is a similar cross-section to that of FIG. 2, but with the etch boat turned upside down and wafers positioned in a furnace boat;

FIG. 4 is a similar cross-section to that of FIG. 2, but with a storage box positioned on the etch boat;

FIG. 5 is a cross-section similar to that of FIG. 4, illustrating the transfer of wafers from etch boat to storage box.

As illustrated in FIG. 1, an etch boat 10, for example molded of a plastic material such as polytetrafluoroethylene (Teflon TM) to resist etchants, is in the form of a trough, open at the bottom and with parallel sides, the sides having a plurality of Vee shaped grooves 11 formed in the inner surfaces thereof. The grooves 11 are dimensioned to hold wafers, a wafer in each groove. Externally, the etch boat 10 has a flat top surface 12. The external shape may vary, but normally the boat is provided with a flat base to the sides, with a foot 13 at each corner. An end wall 14 connects the sides of the boat at one end and a bar 15 connects the sides at the other end. In use, wafers are placed in the etch boat and the whole inserted into the etch chamber.

The etch boat 10, can be a conventional boat, modified by the boring of a hole 16 longitudinally of the boat, breaking through into the Vee grooves 11 at a position above the maximum diameter of the wafers—as seen in FIG. 2. A rod or tube—not shown in FIG. 1, is inserted into the hole 16.

FIG. 2 illustrates the position of wafers 17 in the etch boat 10 and a rod 18 in the hole 16. As will be seen, the rod 18, which can also be a tube, projects into the grooves 11 at one side, just clear of the wafers 17.

For one particular transfer operation, transfer of wafers to a furnace boat, the rod 18 is inserted, as in FIG. 2, and then the etch boat 10 inverted and positioned over a furnace boat, usually of quartz. This is illustrated in FIG. 3. The quartz furnace boat shown at 20. On inversion of the etch boat 10 the wafers 17 drop down a very small amount until they contact the rod 18. The etch boat is positioned over the furnace boat which has a series of transverse grooves or slots 21. The grooves 21 are Vee shaped looking in a direction parallel to the longitudinal axis of the boat, as seen in FIG. 3, and are also of Vee shaped cross-section when viewed normal to the longitudinal axis. This both centers and holds the wafers 17.

As the etch boat 10 is lowered onto the furnace boat 20, the wafers 17 enter the slots 21 and eventually are lifted slightly. The rod 18 is then removed and the etch boat lifted up vertically, leaving the wafers 17 standing in the furnace boat.

Removal of the wafers from the furnace boat is the reverse of the above—positioning the etch boat over the wafers, insertion of the rod 18 and lifting the etch boat up and then turning over.

The operation of transferring wafers to a furnace boat and from a furnace boat is very quick and easy. The particular cross-sectional form of the grooves 11 and slots 21 provides for easy alignment. Edge chipping is avoided and no contamination from handling occurs.

The invention is also applicable to the transfer of wafers to and from other items, such as for example, storage boxes. FIGS. 4 and 5 illustrate such a transfer. In FIG. 4, the wafers 17 are shown in the etch boat 10. The rod 18 is shown inserted although this is not essential. The storage box 25 is positioned on top of the boat 10 with the grooves 11 of the boat 10 aligned with similar grooves 26 in the storage box 25. The whole assembly is turned sideways, the rod 18 removed and then the assembly turned slightly farther until the storage box 25 is lower than the etch boat 10, as illustrated in FIG. 5. The wafers 17 then roll or slide from the etch boat 10 into the storage box 25.

Wafers can be transferred from a storage box to an etch boat by the reverse of the above. The etch boat is aligned on top of the storage boat and then the whole rotated until the storage box is slightly higher than the etch boat, when the wafers will move down into the etch boat. The wafers can then be processed in the etch boat or transferred to, for example, a furnace boat. The use of the rod 18 occurs, as described previously. Thus the etch boat—10 can also be used as a transfer device.

Thus there is provided an arrangement for extremely easy and simple transferring wafers, with the minimum of apparatus, particularly without any additional items other than those actually used in processing, except for the rod 18.

Alignment between the etch boat and other items can be by sight, as for example between etch boat and furnace boat, or small projections on the etch boat can be aligned with recesses in the other item, for example the storage box, as illustrated at 27 and 28 respectively in FIGS. 4 and 5.

The hole 16 is positioned in the wall of the etch boat such that when the rod 18 is inserted it overlaps the wafers 17 in all cases, even if it should happen that the flat 30—normally formed on wafers to provide orientation—should be at the side where the wafers is in the etch boat.

The actual steps carried out in using the etch boat, as described above, are illustrative only and variations in a particular sequence of steps, and in the steps themselves, can occur, depending upon intentions and requirements.

What is claimed is:

1. Apparatus for transferring semiconductor wafers, comprising:
    a holder of trough shaped cross-section including two opposed parallel sides having top and bottom surfaces;
    said top surfaces being flat and including locating means for cooperation with locating means on a further member;
    said sides joined at one end by an end wall extending between said sides at said one end and joined at the other end by a bar extending between said sides at said other end, the holder open at top and bottom between said end wall and said bar;
    a plurality of parallel Vee shaped grooves formed in an inner surface on each side, the grooves extending from said top surfaces and having inwardly inclined lower ends extending in to the inner surface of the side at a position intermediate the top and bottom surfaces, for reception and retention of a semiconductor wafer in each opposed pair of grooves when said holder is in an upright position, at least a major portion of each wafer below said top surfaces;
    a hole extending longitudinally through one side of the holder adjacent to the top surface thereof, the periphery of the hole extending into the Vee grooves at a position above that occupied by a portion of the wafer; and
    a rod slidable axially into and out of said hole;
    the arrangement such that the rod, when inserted into said hole, extends over the periphery of the wafers at a position remote from the centres thereof to retain the wafers in the holder when said holder is in an inverted position, with the edges of the wafers unobstructed for alignment and prepositioning with respect to grooves of said further member;
    said further member including a plurality of Vee-shaped grooves aligned with said Vee-shaped grooves in said holder for reception of wafers therein, a wafer in each groove.

* * * * *